US010249729B1

(12) United States Patent
Chen et al.

(10) Patent No.: US 10,249,729 B1
(45) Date of Patent: Apr. 2, 2019

(54) METHOD FOR FABRICATING METAL REPLACEMENT GATE SEMICONDUCTOR DEVICE USING DUMMY GATE AND COMPOSITE SPACER STRUCTURE

(71) Applicant: UNITED MICROELECTRONICS CORP., Hsin-Chu (TW)

(72) Inventors: Ying-Hsien Chen, Tainan (TW); Chun-Chia Chen, Tainan (TW); Yao-Jhan Wang, Tainan (TW); Chih-wei Yang, Tainan (TW); Te-Chang Hsu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/832,696

(22) Filed: Dec. 5, 2017

(30) Foreign Application Priority Data

Nov. 23, 2017 (CN) .......................... 2017 1 1184416

(51) Int. Cl.
*H01L 29/66* (2006.01)
*H01L 21/8238* (2006.01)
(Continued)

(52) U.S. Cl.
CPC .... *H01L 29/66545* (2013.01); *H01L 21/0214* (2013.01); *H01L 21/0217* (2013.01); *H01L 21/02126* (2013.01); *H01L 21/02164* (2013.01); *H01L 21/02381* (2013.01); *H01L 21/02532* (2013.01); *H01L 21/02636* (2013.01); *H01L 21/308* (2013.01); *H01L 21/3081* (2013.01); *H01L 21/3086* (2013.01); *H01L 21/31053* (2013.01); *H01L 21/823814* (2013.01); *H01L 21/823828* (2013.01); *H01L 21/823842* (2013.01); *H01L 21/823864* (2013.01); *H01L 29/0847* (2013.01); *H01L 29/165* (2013.01); *H01L 29/6656* (2013.01); *H01L 29/66636* (2013.01); *H01L 29/7848* (2013.01)

(58) Field of Classification Search
CPC ....... H01L 29/66545; H01L 21/823828; H01L 21/308; H01L 21/823842; H01L 21/823864
See application file for complete search history.

(56) References Cited

U.S. PATENT DOCUMENTS

2011/0291201 A1 12/2011 Cheng
2015/0380519 A1* 12/2015 Zhao ................ H01L 21/02164
257/410
(Continued)

*Primary Examiner* — Michael Jung
(74) *Attorney, Agent, or Firm* — Winston Hsu

(57) ABSTRACT

A method for fabricating a semiconductor device. After forming SiGe epitaxial layer within the Core_p region, the hard mask is removed. A contact etch stop layer (CESL) is deposited on the composite spacer structure and the epitaxial layer. An ILD layer is deposited on the CESL. The ILD layer is polished to expose a top surface of the dummy gate. The dummy gate and a first portion of the first nitride-containing layer of the composite spacer structure are removed, thereby forming a gate trench and exposing the first gate dielectric layer. The first gate dielectric layer is removed from the gate trench, and a second portion of the first nitride-containing layer and the oxide layer are removed from the composite spacer structure, while leaving the second nitride-containing layer intact.

7 Claims, 4 Drawing Sheets

(51) Int. Cl.
*H01L 21/308* (2006.01)
*H01L 21/02* (2006.01)
*H01L 21/3105* (2006.01)
*H01L 29/165* (2006.01)
*H01L 29/78* (2006.01)
*H01L 29/08* (2006.01)

(56) References Cited

U.S. PATENT DOCUMENTS

2018/0138280 A1* 5/2018 Li ..................... H01L 29/41775
2018/0145172 A1* 5/2018 Zhou ................ H01L 21/823468
2018/0151670 A1* 5/2018 Wu ..................... H01L 21/2256

* cited by examiner

METHOD FOR FABRICATING METAL REPLACEMENT GATE SEMICONDUCTOR DEVICE USING DUMMY GATE AND COMPOSITE SPACER STRUCTURE

BACKGROUND OF THE INVENTION

1. Field of the Invention

The present invention relates to the technical field of semiconductor manufacturing, and more particularly to a method for fabricating a semiconductor device.

2. Description of the Prior Art

With the development of integrated circuit technology, the feature sizes become smaller and smaller, and the physical limitation of the mobility of electrons and holes in the silicon material has become the bottleneck of improving the device performance.

It is known that strained silicon technology increases carrier mobility by epitaxially growing a material having a different lattice constant from silicon near the channel region. For example, pFET transistors often utilize a SiGe epitaxial layer with a lattice constant greater than that of Si, causing lattice mismatch and increasing compressive stress on the Si channel, thereby improving hole mobility.

With the miniaturization of the device size, the control of the SiGe-to-gate edge distance (S2G) is increasingly important for ensuring the electrical performance of the transistor device, especially the pFET transistor S2G control and control of the within wafer S2G bias of the input/output (IO) transistor and the pFET transistor.

SUMMARY OF THE INVENTION

It is one object of the present invention is to provide an improved method of fabricating a semiconductor device which solves the deficiencies of the prior art.

According to one aspect of the invention, a method for fabricating a semiconductor device is disclosed. A first gate dielectric layer is formed on a substrate. A dummy gate is then formed on the first gate dielectric layer. A composite spacer film is then deposited on the dummy gate and the substrate. The composite spacer film comprises a first nitride-containing layer, an oxide layer on the first nitride-containing layer, and a second nitride-containing layer on the oxide layer. A hard mask layer is then deposited on the composite spacer film. The hard mask layer and the composite spacer film are anisotropically etched, thereby forming a composite spacer structure on each sidewall of the dummy gate. A recessed region is then formed in the substrate. The recessed region is adjacent to the composite spacer structure. An epitaxial layer is then grown in the recessed region. The hard mask layer is removed from the composite spacer structure. A contact etch stop layer (CESL) is deposited on the composite spacer structure and the epitaxial layer. An inter-layer dielectric (ILD) layer is then deposited on the CESL. The ILD layer is subjected to a polishing process so as to expose a top surface of the dummy gate. The dummy gate and a first portion of the first nitride-containing layer are removed, thereby forming a gate trench and exposing the first gate dielectric layer. The first gate dielectric layer is removed from the gate trench and a second portion of the first nitride-containing layer and the oxide layer are selectively removed from the composite spacer structure, while leaving the second nitride-containing layer intact.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
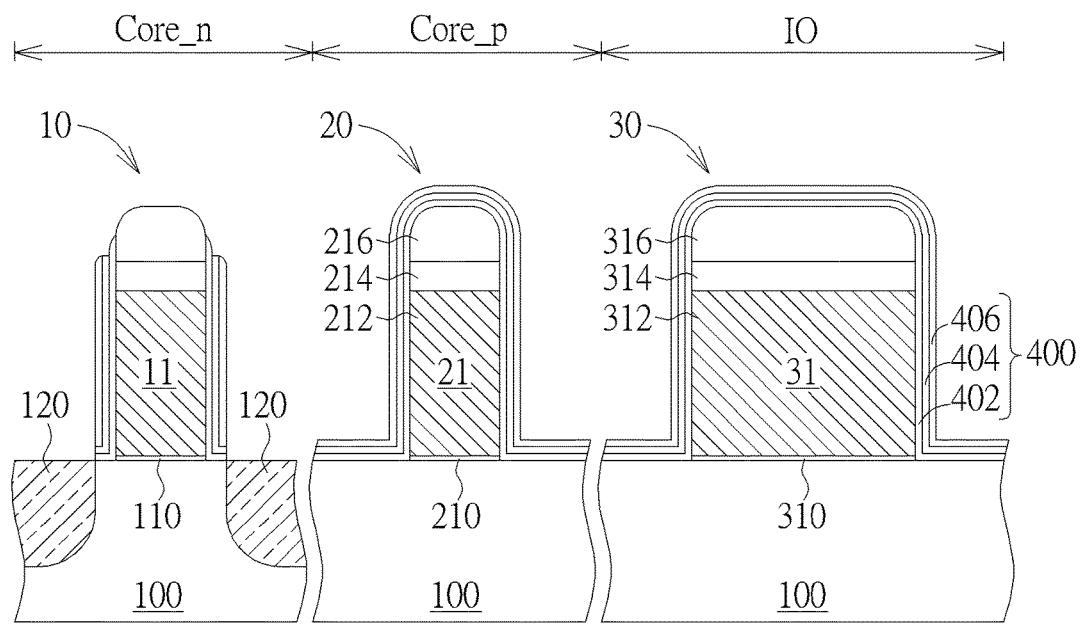
FIG. 1 to FIG. 8 are schematic, cross-sectional diagrams showing a method for fabricating a semiconductor device according to one embodiment of the invention.

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present disclosure.

The following detailed description is, therefore, not to be taken in a limiting sense, and the scope of the present invention is defined only by the appended claims, along with the full scope of equivalents to which such claims are entitled. One or more implementations of the present invention will now be described with reference to the attached drawings, wherein like reference numerals are used to refer to like elements throughout, and wherein the illustrated structures are not necessarily drawn to scale.

Please refer to FIG. 1 to FIG. 8. FIG. 1 to FIG. 8 are schematic, cross-sectional diagrams showing a method for fabricating a semiconductor device according to one embodiment of the invention. As shown in FIG. 1, first, a substrate 100, for example, a semiconductor substrate, is provided. The semiconductor substrate may include a silicon substrate, but is not limited thereto. According to an embodiment of the present invention, at least three regions: Core_n region, Core_p region and IO region are provided on a substrate 100. The Core_n region, the Core_p region, and the IO region are respectively used to form an nFET transistor 10, a pFET transistor 20 and an input/output (IO) device 30. Among them, the nFET transistor 10 and the pFET transistor 20 may be the components of a core circuit.

According to an embodiment of the present invention, the nFET transistor 10 includes a dummy gate 11. An epitaxial layer 120, such as a SiP epitaxial layer, may be formed in the substrate 100 on each side of the dummy gate 11 as source/drain region of the nFET transistor 10. The pFET transistor 20 includes a dummy gate 21. The IO device 30 includes a dummy gate 31.

According to an embodiment of the present invention, the dummy gate 21 may include a polysilicon layer 212, a nitride layer 214, and an oxide layer 216. According to an embodiment of the present invention, the dummy gate 31 may include a polysilicon layer 312, a nitride layer 314, and an oxide layer 316.

According to an embodiment of the present invention, the nitride layers 214 and 314 may comprise silicon nitride, silicon oxynitride, or silicon oxycarbonitride, but are not limited thereto. The oxide layers 216 and 316 may comprise silicon oxide, but not limited thereto. It should be understood by those skilled in the art that the structures of the dummy gates 21 and 31 are merely illustrative and not limited to the above materials or combinations.

According to an embodiment of the present invention, a gate dielectric layer 110 is formed between the dummy gate 11 and the substrate 100. A gate dielectric layer 210 is formed between the dummy gate 21 and the substrate 100. A gate dielectric layer 310 is formed between the dummy gate 31 and the substrate 100. According to an embodiment of the invention, the thickness of the gate dielectric layers 110, 210 is approximately equal to the thickness of the gate dielectric layer 310.

According to an embodiment of the present invention, a composite spacer film 400 is formed in the Core_p region and the IO region. The composite spacer film 400 includes a first nitrogen-containing layer 402, an oxide layer 404 on the first nitrogen-containing layer 402, and a second nitrogen-containing layer 406 disposed on the oxide layer 404. The composite spacer film 400 is conformally deposited on the dummy gates 21 and 31 and the substrate 100. The oxide layer 404 is deposited by an atomic layer deposition (ALD) method.

According to an embodiment of the present invention, the first nitrogen-containing layer 402 may comprise silicon oxycarbonitride (SiOCN) or silicon oxynitride (SiON), for example, SiOCN, and may have a thickness of about 30 angstroms. The oxide layer 404 may comprise silicon oxide, for example, and may have a thickness of about 30 angstroms. The second nitrogen-containing layer 406 may comprise SiOCN or SiON, for example, SiOCN, and may have a thickness of about 40 angstroms.

Figure 2:
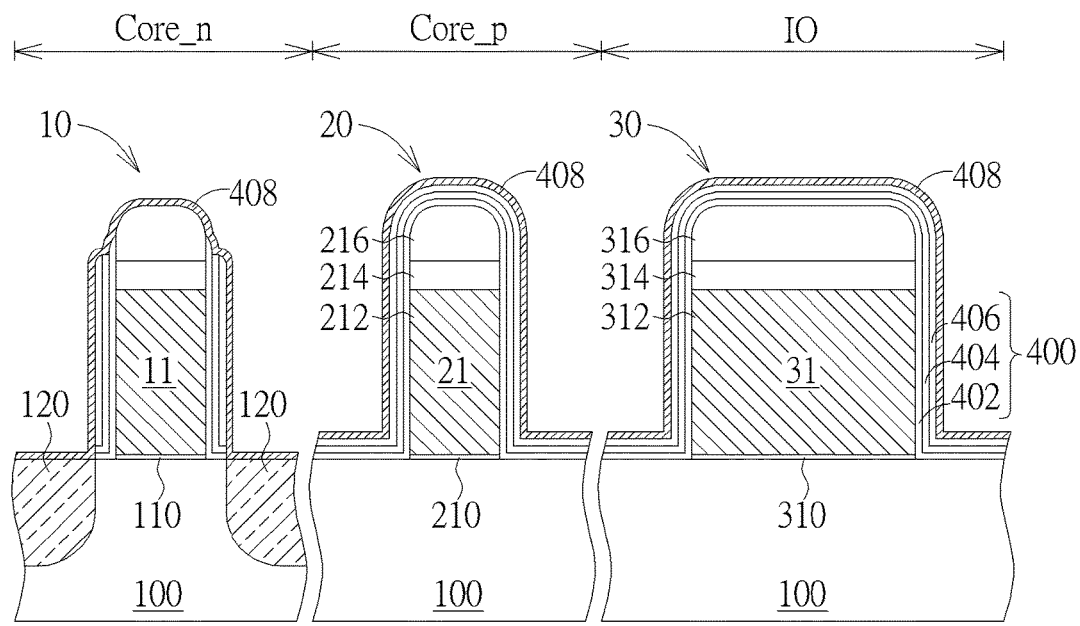

As shown in FIG. 2, a hard mask layer 408 is then deposited on the substrate 100 in a blanket manner. In the Core_p region and the IO region, the hard mask layer 408 is conformally deposited on the composite spacer film 400. According to an embodiment of the present invention, the hard mask layer 408 may comprise silicon nitride, for example, having a thickness of about 30 to 50 angstroms. According to an embodiment of the present invention, for example, the hard mask layer 408 is deposited to a thickness of about 30 angstroms in the Core_p region and about 50 angstroms in the IO region.

Figure 3:
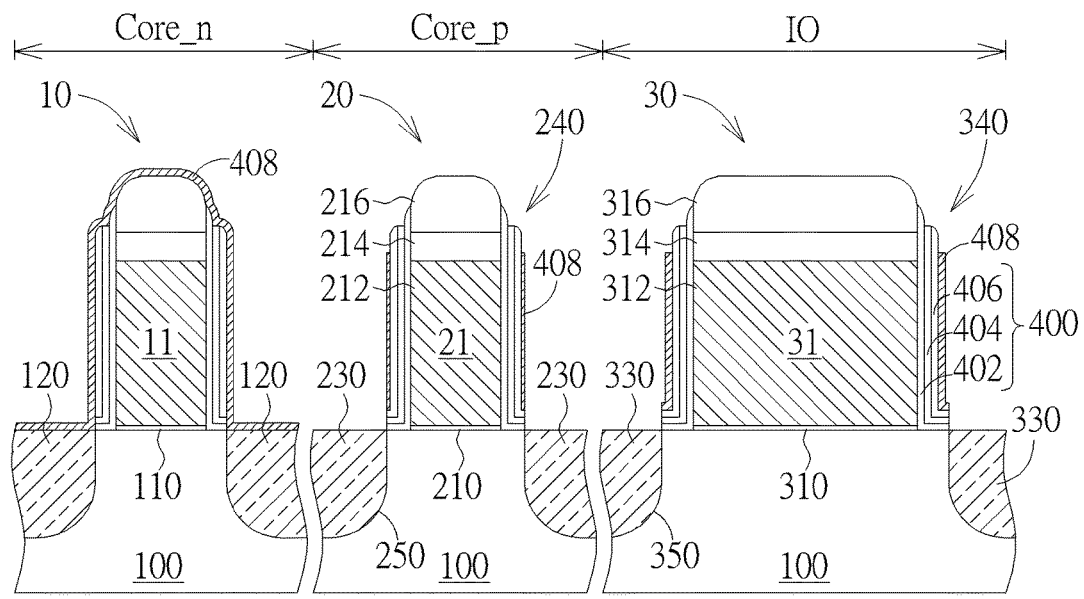

As shown in FIG. 3, an etching process is performed on the Core_p region and the IO region (the Core_n region covered with photoresist) to anisotropically etch the hard mask layer 408 and the composite spacer film 400, thereby forming composite spacer structures 240 and 340 on the sidewalls of the dummy gates 21 and 31, respectively. The substrate 100 in the Core_p region and the IO region may be further etched to form recessed regions 250, 350 in the substrate 100. The recessed regions 250, 350 are respectively adjacent to the composite spacer structures 240, 340.

Subsequently, the photoresist (not shown) covering the Core_n region can be removed to reveal the hard mask layer 408 in the Core_n region. A selective epitaxial growth (SEG) process is performed to form epitaxial layers 230 and 330 in the recessed regions 250 and 350, respectively. According to an embodiment of the present invention, an ion implantation process may be performed to implant dopants, such as boron, into the epitaxial layers 230 and 330 to form the source/drain regions of the pFET transistor 20 and the IO device 30.

Figure 4:
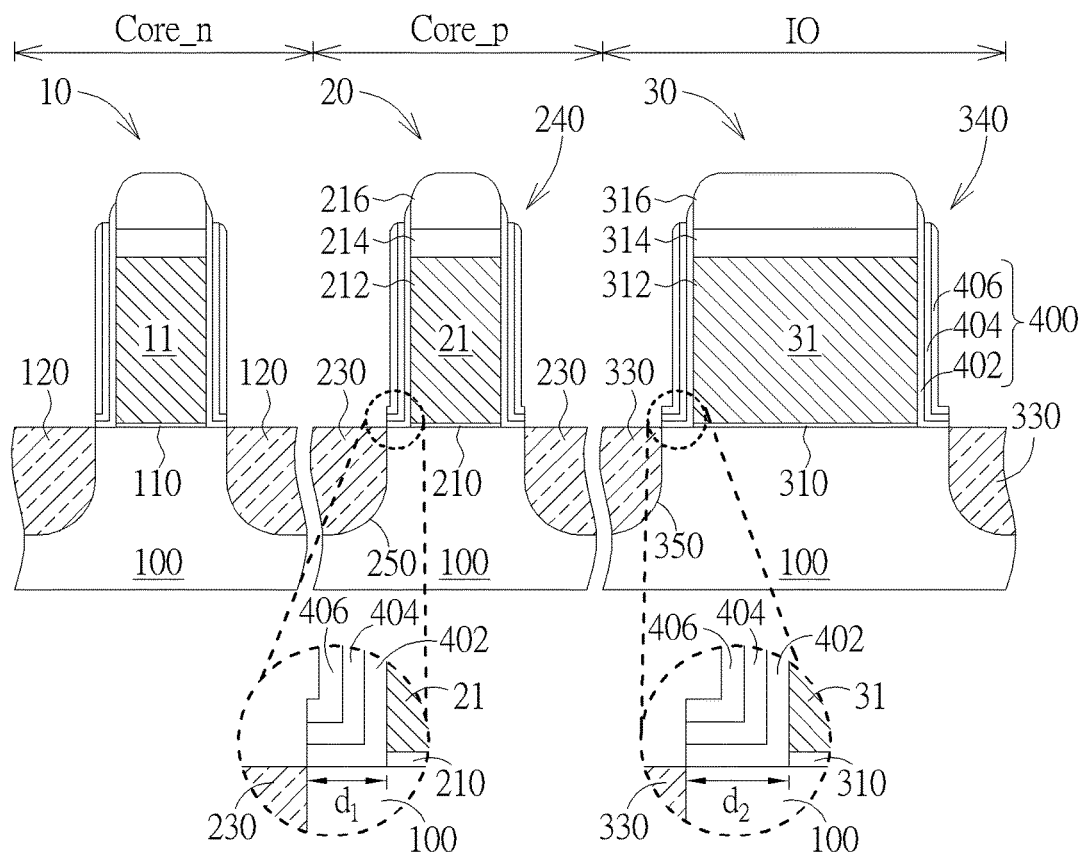

As shown in FIG. 4, the hard mask layer 408 is then removed from the Core_n region and from the composite spacer structures 240, 340. Removal of the hard mask layer 408 may utilize wet etching methods, such as, but not limited to, hot phosphoric acid solutions.

It can be seen from the enlarged view of the partial area in FIG. 4 that the lateral distance $d_1$ from the epitaxial layer 230 to the edge of the dummy gate 21 in the Core_p region is approximately equal to the thickness of the three layers of the first nitrogen-containing layer 402, the oxide layer 404, and the second nitrogen-containing layer 406 (100 angstroms) plus the thickness of the hard mask layer 408 (the hard mask layer 408 is deposited to a thickness of about 30 angstroms in the Core_p region) for a total of 130 angstroms.

The lateral distance $d_2$ from the epitaxial layer 330 to the edge of the dummy gate 31 in the IO region is approximately equal to the thickness (100 angstroms) of the three layers of the first nitrogen-containing layer 402, the oxide layer 404 and the second nitrogen-containing layer 406 plus the thickness of the hard mask layer 408 (the thickness of the original hard mask layer 408 deposited in the IO region is about 50 angstroms) for a total of 150 angstroms.

Figure 5:
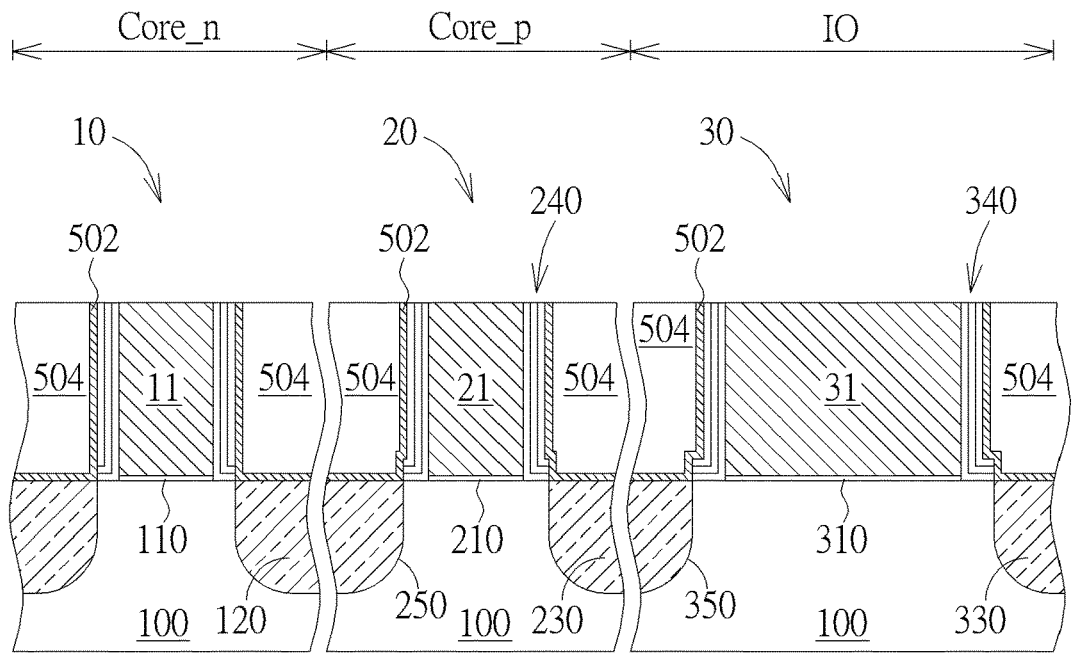

As shown in FIG. 5, an etch stop layer 502, e.g., a silicon nitride layer, is then blanket deposited on the Core_n region, the Core_p region and the IO region, so that the etch stop layer 502 is conformally deposited on the composite spacer structures 240, 340 and the epitaxial layer 120, 230, 330. An interlayer dielectric (ILD) layer 504, such as a silicon oxide layer, is then deposited on the etch stop layer 502. The interlayer dielectric layer 504 and the etch stop layer 502 are subjected to a polishing process so as to expose a top surface of the dummy gate 11, 21, 31.

Figure 6:
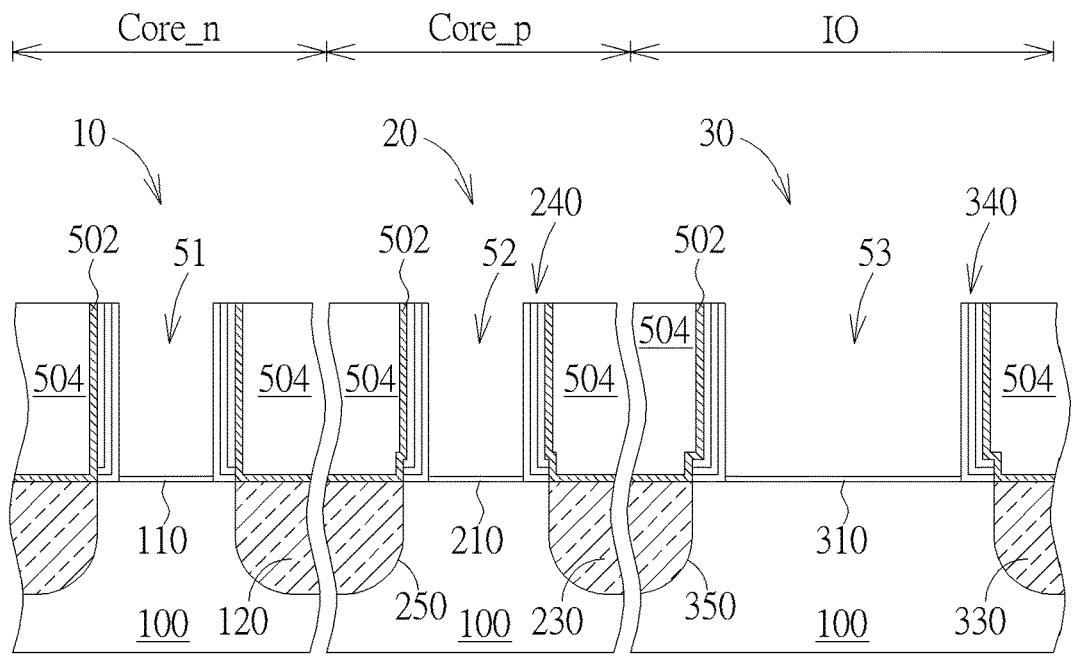

As shown in FIG. 6, the dummy gates 11, 21, 31 and a first portion of the first nitrogen-containing layer 402 are then removed thereby forming gate trenches 51, 52, 53. For example, the first portion of the first nitrogen-containing layer 402 has a thickness of about 10 angstroms. The gate trenches 51, 52, 53 reveal gate oxide layers 110, 210, 310, respectively.

Figure 7:
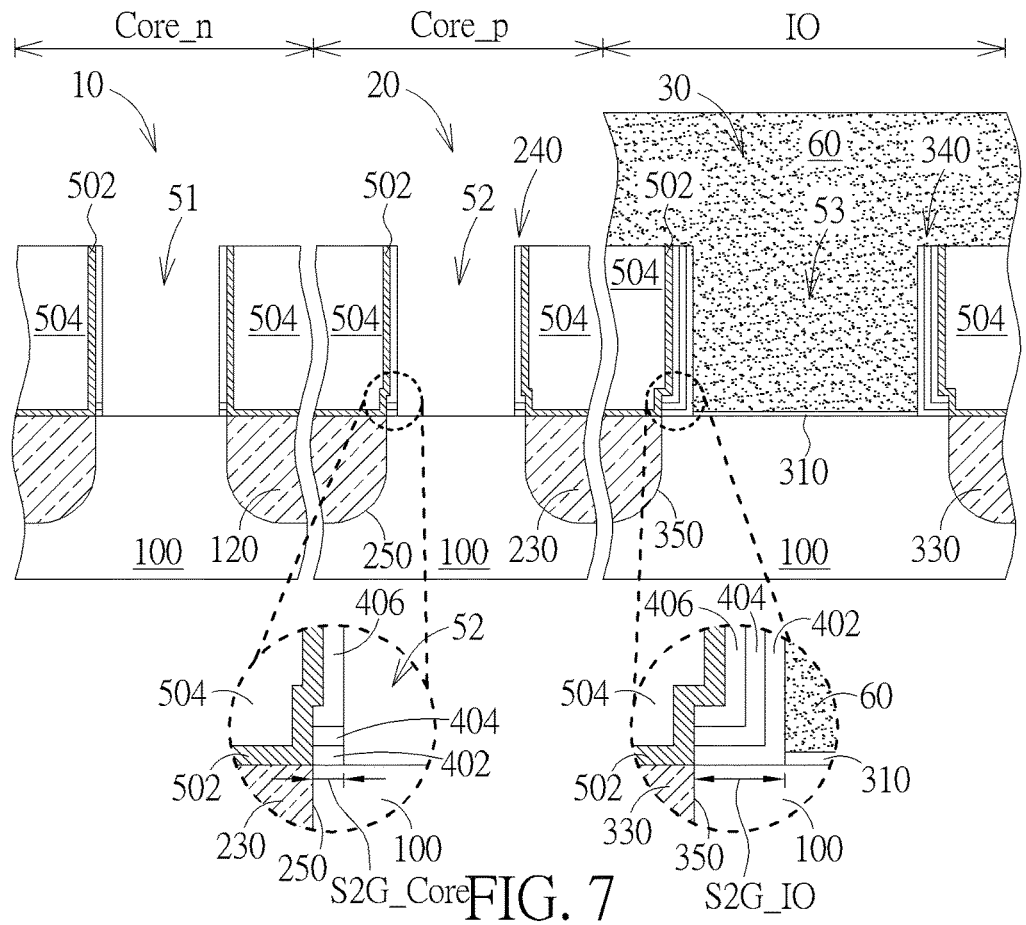

As shown in FIG. 7, the IO area is covered with a photoresist layer 60 and only the Core_n area and the Core_p area are exposed. An etching process is performed to remove the gate dielectric layers 110 and 210 from the gate trenches 51 and 52 and selectively remove a second portion of the first nitrogen-containing layer 402 and the oxide layer 404 from the composite spacer structure 400, while leaving the second nitrogen-containing layer 406 intact. For example, the thickness of the second portion of the first nitrogen-containing layer 402 is about 20 angstroms. In other words, this step removes all the vertical portions of the first nitrogen-containing layer 402 and the oxide layer 404 to expose the second nitrogen-containing layer 406. At this point, the thickness of the second nitrogen-containing layer 406 is substantially equivalent to the thickness originally deposited.

It can be seen from the partial enlarged view of FIG. 7 that the oxide layer 404 and the second portion of the first nitrogen-containing layer 402 are selectively removed by an etching process that removes the gate dielectric layers 110 and 210 from the gate trenches 51 and 52. The distance S2G core from the SiGe epitaxial layer to gate edge in the Core_p region is approximately equal to the thickness of the second nitrogen-containing layer 406 (40 angstroms) plus the thickness of the original hard mask layer 408 (the original thickness of the hard mask layer 408 in the Core_p region is about 30 angstroms) for a total of 70 angstroms.

The distance S2G_IO from the SiGe epitaxial layer to the gate edge in the IO region is approximately equal to the combined thickness of the remaining first nitrogen-containing layer 402 (20 angstroms), the thickness of the oxide layer 404 and the second nitrogen-containing layer 406 (70 angstroms), plus the thickness of the hard mask layer 408 (the hard mask layer 408 is deposited in the IO region to a thickness of about 50 angstroms) for a total of 140 angstroms. As a result, the within wafer S2G bias between the 10 transistor and the pFET transistor can be controlled to a target value of 70 angstroms.

Figure 8:
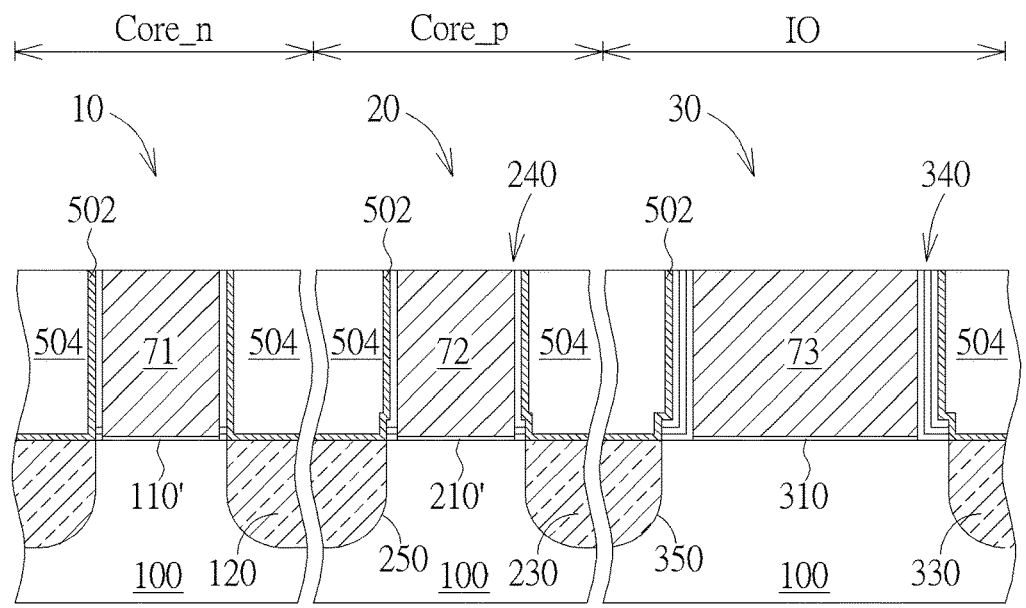

Subsequently, as shown in FIG. 8, the photoresist layer 60 covering the IO region is removed, and the gate dielectric layers 110', 210' are formed on the substrate 100 in the gate trenches 51 and 52 of the Core_n region and the Core_p region, respectively. According to an embodiment of the present invention, the thickness of the gate dielectric layer 110', 210' is smaller than that of the gate dielectric layer 310. Then, metal gates 71, 72 and 73 are respectively formed in the gate trenches 51, 52 and 53. The fabrication of the metal gates 71, 72, and 73 may utilize a replacement metal gate (RMG) process, which is well known in the art, and details are not described herein.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
   providing a silicon substrate;
   forming a first gate dielectric layer on the silicon substrate;
   forming a dummy gate on the first gate dielectric layer;
   conformally depositing a composite spacer film on the dummy gate and the silicon substrate, wherein the composite spacer film comprises a first nitride-containing layer, an oxide layer on the first nitride-containing layer, and a second nitride-containing layer on the oxide layer;
   conformally depositing a hard mask layer on the composite spacer film;
   anisotropically etching the hard mask layer and the composite spacer film, thereby forming a composite spacer structure on each sidewall of the dummy gate;
   forming a recessed region in the silicon substrate and adjacent to the composite spacer structure;
   forming a SiGe epitaxial layer in the recessed region;
   removing the hard mask layer from the composite spacer structure;
   conformally depositing a contact etch stop layer (CESL) on the composite spacer structure and the SiGe epitaxial layer;
   depositing an inter-layer dielectric (ILD) layer on the CESL;
   subjecting the ILD layer to a polishing process so as to expose a top surface of the dummy gate;
   removing the dummy gate and a first portion of the first nitride-containing layer, thereby forming a gate trench and exposing the first gate dielectric layer; and
   removing the first gate dielectric layer from the gate trench, and selectively removing a second portion of the first nitride-containing layer and the oxide layer from the composite spacer structure, while leaving the second nitride-containing layer intact.

2. The method according to claim 1 further comprising:
   forming a second gate dielectric layer on the silicon substrate within the gate trench; and
   forming a gate electrode in the gate trench.

3. The method according to claim 1, wherein the first nitride-containing layer comprises SiOCN or SiON.

4. The method according to claim 3, wherein the second nitride-containing layer comprises SiOCN or SiON.

5. The method according to claim 4, wherein the oxide layer comprises silicon oxide.

6. The method according to claim 1, wherein the hard mask layer comprises silicon nitride.

7. The method according to claim 1, wherein the CESL comprises silicon nitride.

* * * * *